United States Patent
Yagisawa

(10) Patent No.: US 9,585,244 B2
(45) Date of Patent: Feb. 28, 2017

(54) CONNECTOR AND FLEXIBLE PRINTED BOARD

(71) Applicant: FUJITSU LIMITED, Kawasaki-shi, Kanagawa (JP)

(72) Inventor: Takatoshi Yagisawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/016,096

(22) Filed: Aug. 31, 2013

(65) Prior Publication Data

US 2014/0141629 A1  May 22, 2014

(30) Foreign Application Priority Data

Nov. 16, 2012 (JP) ................................. 2012-252693

(51) Int. Cl.
| | |
|---|---|
| *H01R 12/00* | (2006.01) |
| *H05K 1/02* | (2006.01) |
| *H01R 12/77* | (2011.01) |
| *H01R 13/6471* | (2011.01) |

(Continued)

(52) U.S. Cl.
CPC ......... *H05K 1/0277* (2013.01); *H01R 12/772* (2013.01); *H01R 12/775* (2013.01); *H01R 13/6471* (2013.01); *H05K 1/117* (2013.01); *H01R 12/777* (2013.01); *H01R 13/6474* (2013.01); *H05K 1/0219* (2013.01); *H05K 1/118* (2013.01); *H05K 2201/0715* (2013.01);

(Continued)

(58) Field of Classification Search
CPC ....... H01R 12/77; H01R 13/6471; H05K 1/11

USPC .. 439/77, 607.1, 67, 62, 495, 259, 834, 668, 439/260; 200/600; 174/254

See application file for complete search history.

(56) References Cited

U.S. PATENT DOCUMENTS

| | | | |
|---|---|---|---|
| 3,283,108 A | | 11/1966 | Collier |
| 5,839,917 A | * | 11/1998 | Takahashi ............. H01R 12/79 439/495 |

(Continued)

FOREIGN PATENT DOCUMENTS

| | | |
|---|---|---|
| CN | 101442161 | 6/2012 |
| JP | 2001-024299 | 1/2001 |

(Continued)

OTHER PUBLICATIONS

"SFF-8662 Specification QSFP+ 28 Gb/s 4X Connector (Style A)," Rev. 2.1, SFF Committee, May 21, 2012, pp. 1-21.

(Continued)

*Primary Examiner* — Abdullah Riyami
*Assistant Examiner* — Nader Alhawamdeh
(74) *Attorney, Agent, or Firm* — Fujitsu Patent Center

(57) ABSTRACT

A connector includes a housing, first and second terminals, and a third terminal. The housing accommodates an end portion of a circuit board, the first and second terminals respectively contact first and second contacts among a plurality of contacts arranged side by side on a first side of the end portion of the circuit board. The third terminal contacts a third contact on a second side of the end portion of the circuit board opposite to the first side, and the third contact is arranged at a position facing the first contact with the circuit board therebetween. A support body of dielectric material supports a position on the second side facing the second contact with the circuit board therebetween.

18 Claims, 9 Drawing Sheets

(51) Int. Cl.
*H05K 1/11* (2006.01)
*H01R 13/6474* (2011.01)

(52) U.S. Cl.
CPC .............. *H05K 2201/09618* (2013.01); *H05K 2201/2009* (2013.01)

(56) References Cited

U.S. PATENT DOCUMENTS

| | | | | |
|---|---|---|---|---|
| 6,224,418 | B1* | 5/2001 | Miura | H01R 12/79 439/260 |
| 7,172,446 | B1* | 2/2007 | Hashimoto | H01R 12/774 439/260 |
| 7,367,838 | B2* | 5/2008 | Takahashi | H01R 43/007 439/495 |
| 7,374,430 | B2* | 5/2008 | Nagawatari | H01R 12/79 439/67 |
| 7,789,688 | B2* | 9/2010 | Hemmi | H01R 12/771 439/260 |
| 2002/0187674 | A1* | 12/2002 | Hirose | H01R 12/88 439/495 |
| 2004/0023551 | A1* | 2/2004 | Suzuki | H01R 12/592 439/495 |
| 2004/0033717 | A1* | 2/2004 | Peng | H01R 12/57 439/495 |
| 2006/0134969 | A1* | 6/2006 | Takaku | H01R 12/775 439/495 |
| 2006/0157271 | A1 | 7/2006 | Miura et al. | |
| 2006/0189204 | A1* | 8/2006 | Wang | H01R 12/88 439/495 |
| 2007/0054545 | A1* | 3/2007 | Takahira | H01R 12/79 439/495 |
| 2007/0072446 | A1* | 3/2007 | Hashimoto | H01R 12/88 439/66 |
| 2007/0076400 | A1* | 4/2007 | Shimada | H01R 12/79 361/809 |
| 2008/0176424 | A1* | 7/2008 | Wu | H01R 12/592 439/77 |
| 2009/0004910 | A1* | 1/2009 | Takahira | H01R 12/79 439/495 |
| 2009/0008131 | A1* | 1/2009 | Shibata | H05K 1/0219 174/254 |
| 2009/0017645 | A1* | 1/2009 | Suzuki | H01R 12/88 439/62 |
| 2009/0068860 | A1* | 3/2009 | Suzuki | H01R 12/88 439/67 |
| 2009/0298315 | A1* | 12/2009 | Iida | H01R 12/79 439/259 |
| 2009/0317987 | A1* | 12/2009 | Tanaka | H01R 12/778 439/67 |
| 2009/0318001 | A1* | 12/2009 | Hemmi | H01R 12/771 439/260 |
| 2010/0055940 | A1* | 3/2010 | Wang | H01R 12/79 439/77 |
| 2010/0215324 | A1 | 8/2010 | Ban | |
| 2011/0212655 | A1* | 9/2011 | Hemmi | H01R 13/41 439/752 |
| 2012/0238118 | A1* | 9/2012 | Yoshida | H01R 12/57 439/259 |
| 2012/0289092 | A1* | 11/2012 | Shimada | H01R 13/641 439/629 |
| 2012/0305294 | A1* | 12/2012 | Takaura | H05K 1/117 174/254 |
| 2013/0065417 | A1* | 3/2013 | Kurachi | H01R 12/79 439/325 |
| 2014/0141629 | A1* | 5/2014 | Yagisawa | H05K 1/0277 439/77 |
| 2014/0174796 | A1* | 6/2014 | Watanabe | H05K 1/0266 174/254 |

FOREIGN PATENT DOCUMENTS

| | | |
|---|---|---|
| JP | 2008-193000 | 8/2008 |
| JP | 2010-191346 | 9/2010 |
| WO | 2006126431 | 11/2006 |

OTHER PUBLICATIONS

Extended European Search Report [hereinabove "EESR"] dated Mar. 4, 2014, mailed by European Patent Office in connection with corresponding EP Application No. 13184297.3.
CNOA—First Notification of Office Action of Chinese Patent Application No. 201310432181.0 dated Jul. 2, 2015.
JPOA—Office Action of Japanese Patent Application No. 2012-252693 dated Apr. 26, 2016, with partial English translation.

* cited by examiner

CONNECTOR AND FLEXIBLE PRINTED BOARD

CROSS-REFERENCE TO RELATED APPLICATION

This application is based upon and claims the benefit of priority of the prior Japanese Patent Application No. 2012-252693, filed on Nov. 16, 2012, the entire contents of which are incorporated herein by reference.

FIELD

The embodiments discussed herein are related to a connector and a flexible printed board.

BACKGROUND

A connector used for electrically connecting with a circuit board has been known (refer to Non-Patent Document 1, for example).

As a related art, a connector for connecting a flexible printed board, which is a resin board with a wiring film formed thereon, with a wiring layer of a circuit board has been known.

The connector is arranged between the wiring film of the flexible printed board and the wiring layer of the circuit board and includes an anisotropic conductive material which is conductive in the thickness direction but not conductive in the plane direction, and an elastic member which presses the flexible printed board against the circuit board at a position where the anisotropic conductive material is arranged.

In the related art, there have been proposed various kinds of connectors used for electrically connecting with a circuit board.

Patent Document 1: Japanese Laid-open Patent Publication No. 2001-24299

None-Patent Document 1: SSF-8662 Specification QSFP+28 Gb/s 4X Connector (Style A) Rev. 2.1, SFF Committee, May 21, 2012

SUMMARY

According to an aspect of the embodiments, a connector including a housing that accommodates an end portion of a circuit board; first and second terminals that respectively contact first and second contacts among a plurality of contacts arranged side by side on a first side of the end portion of the circuit board; and a third terminal.

The third terminal contacts a third contact on a second side of the end portion of the circuit board opposite to the first side, and the third contact is arranged at a position facing the first contact with the circuit board therebetween, wherein a support body of dielectric material supports a position on the second side facing the second contact with the circuit board therebetween.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing a connector and a flexible printed board of the present embodiment in detail, a multilayer circuit board and the problems thereof will first be described with reference to FIG. 1A and FIG. 1B.

Figure 1A:
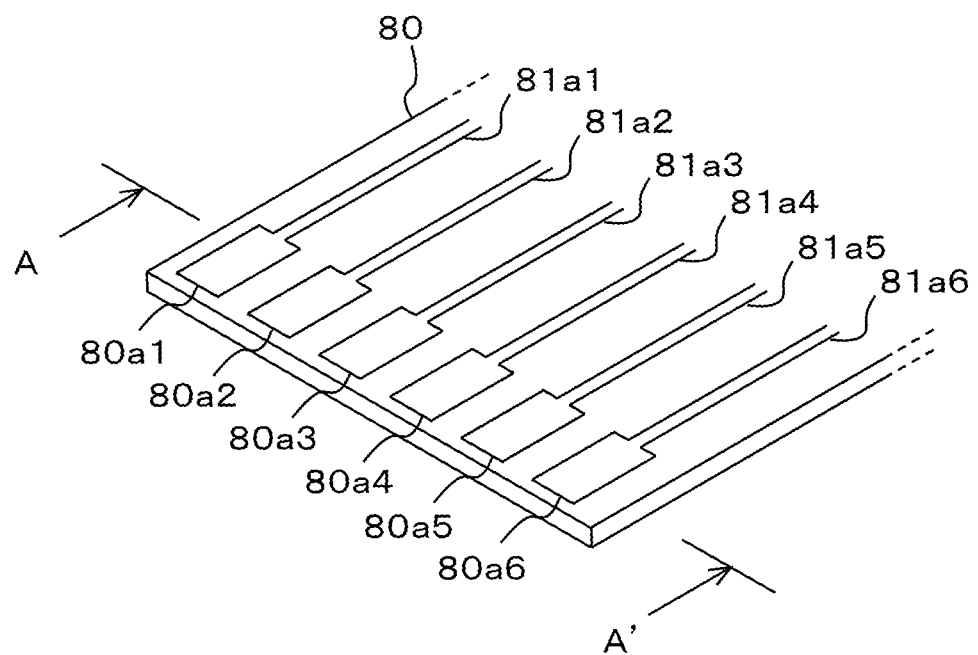
FIG. 1A is a schematic perspective view illustrating a multilayer circuit board.
Figure 1B:
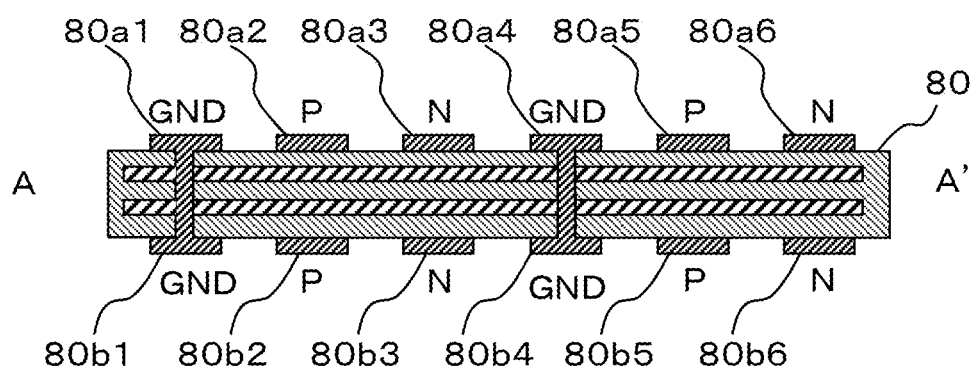
FIG. 1B is a cross-sectional view taken along a line A-A' of FIG. 1A.

FIG. 1A is a schematic perspective view illustrating the multilayer circuit board and FIG. 1B is a cross-sectional view taken along a line A-A' of FIG. 1A. Conductive lines $81a1$ to $81a6$ are arranged side by side on a front side of the multilayer circuit board 80, and front side contacts $80a1$ to $80a6$ which are respectively and electrically connected to the conductive lines $81a1$ to $81a6$ are arranged at an end portion of the multilayer circuit board 80. Similarly, a plurality of conductive lines are also arranged side by side on a back side of the multilayer circuit board 80 and are respectively and electrically connected to back side contacts $80b1$ to $80b6$ arranged at the end portion of the multilayer circuit board 80.

When the multilayer circuit board 80 is connected to a connector, the front side contacts $80a1$ to $80a6$ and the back side contacts $80b1$ to $80b6$ are pressed against terminals of the connector to be respectively connected to the terminals.

The conductive lines $81a2$ and $81a3$ are high speed differential signal lines through which Positive and Negative signals respectively flow. The conductive lines $81a5$ and $81a6$ are also high speed differential signal lines through which Positive and Negative signals respectively flow. In addition, the back side contacts $80b2$ and $80b3$ are contacts of the high speed differential signal lines through which Positive and Negative signals respectively flow. The back side contacts $80b5$ and $80b6$ are also contacts of the high speed differential signal lines through which Positive and Negative signals respectively flow.

The conductive lines $81a1$ and $81a4$ and the front side contacts $80a1$ and $80a4$ surrounding the high speed differential signal lines $81a2$ and $81a3$ and the contacts $80a2$ and $80a3$ thereof constitute a ground pattern. Thus, impedance is matched by surrounding the high speed differential signal lines with the ground pattern.

As a circuit board becomes thinner, narrower lines are arranged to maintain impedance of the high speed signal lines. For example, when the high speed signal line is arranged on a flexible printed board with a thickness of approximately 50 µm, the line width is approximately 100 µm. On the other hand, a width of a contact in contact with a terminal of a connector is wider than the line width to facilitate contact between the contact and the terminal. For example, the width of the contact is preferably 200 µm or more. As a result, the impedance is reduced due to an increase in capacitance at the contact, which may lead to deterioration in transmission characteristics of the high speed signal lines.

Figure 2:
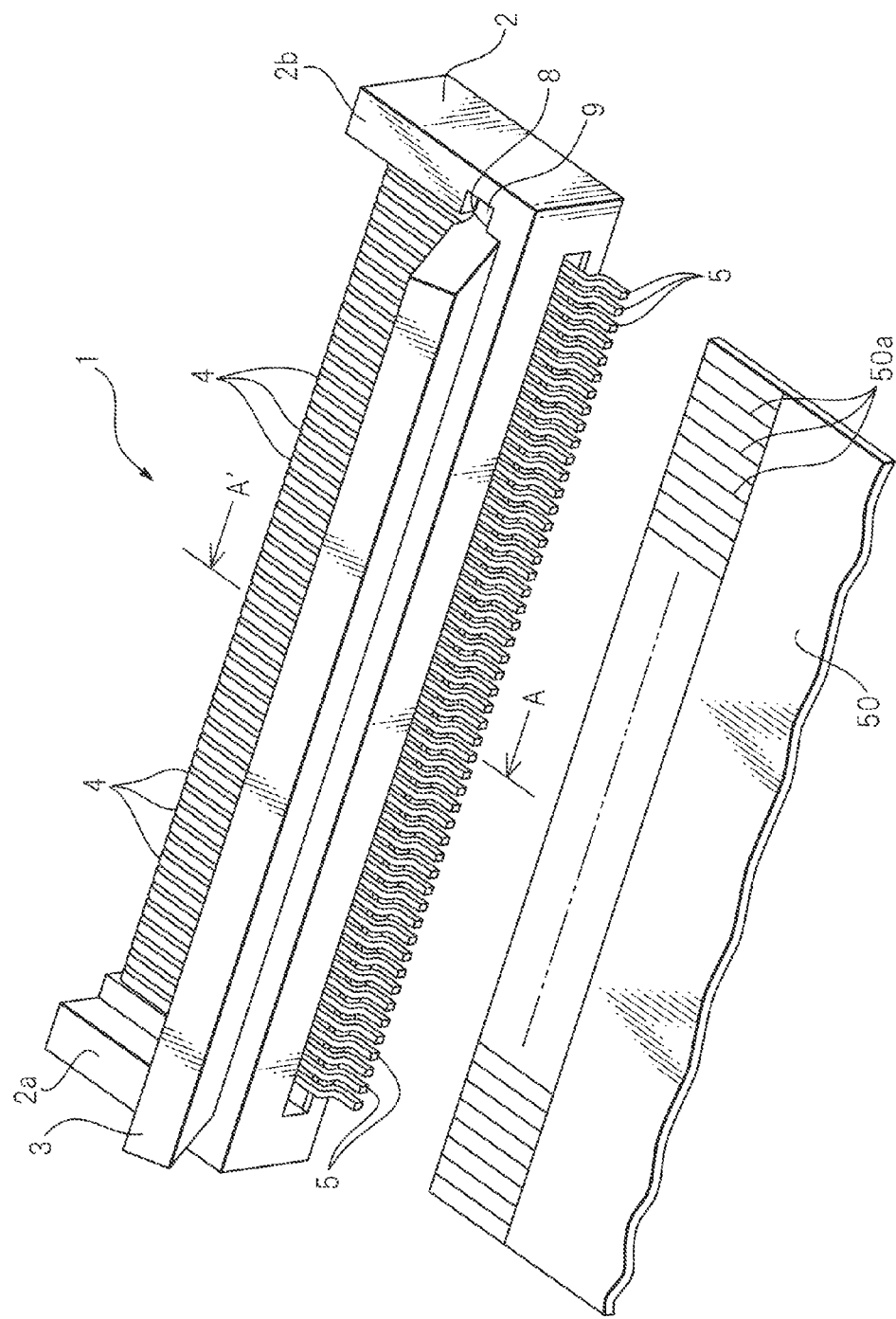
FIG. 2 is a perspective view of an example of a flexible printed board-connecting connector.
Figure 3:
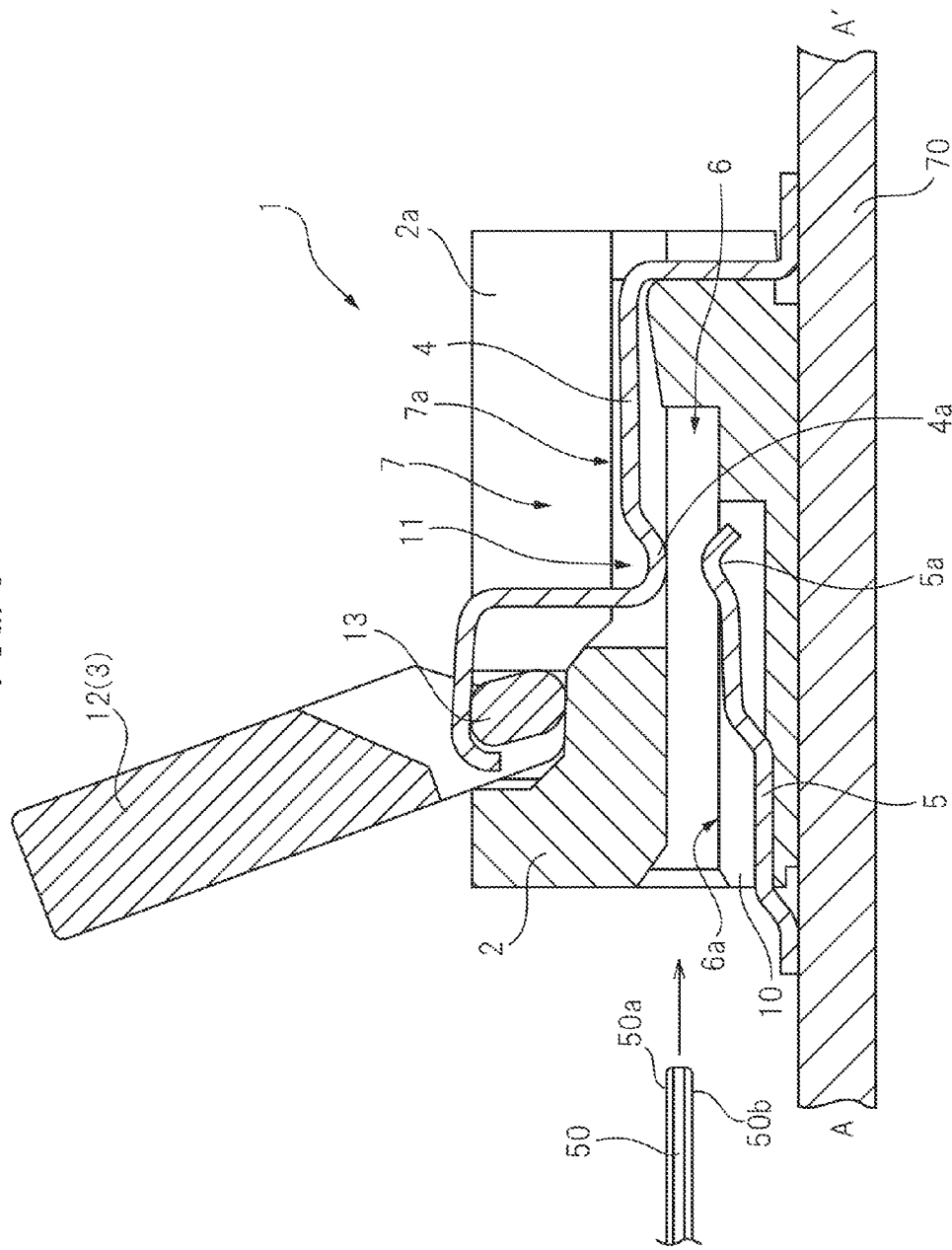
FIG. 3 is a cross-sectional view of the flexible printed board-connecting connector taken along a line A-A' of FIG. 2.

Hereinafter, the connector and the flexible printed board according to the present embodiment will be described in detail with reference to the accompanying drawings. FIG. 2 is a perspective view of an example of a flexible printed board-connecting connector. FIG. 3 is a cross-sectional view taken along a line A-A' of FIG. 2. The flexible printed board-connecting connector may be referred to as "the connector" in the following description.

In the following description, the connector with a back flip lock structure is described as an example. In the back flip lock structure, an actuator which holds and makes contact with the flexible printed board is arranged at the opposite side to the flexible printed board to be held. However, this exemplification is not intended to limit the connector as described herein to be applied to those with the back flip lock structure. The connector described herein may be a connector with a front flip lock structure in which an actuator is arranged at the same side as the flexible printed board or a connector with other structure.

The connector 1 includes a housing 2, a lock lever 3 rotatably mounted on the housing 2, a plurality of front side terminals 4, 4 . . . being mounted from an upper side of the housing 2, and a plurality of back side terminals 5, 5 . . . being mounted from the front side of the housing 2. The front side terminal 4 and the back side terminals 5 are electrically connected to conductive patterns of a circuit board 70.

The housing 2 is formed of an insulating resin of dielectric material in a rectangular shape and a board accommodating recess 6 with a horizontally long slit shape is concavely arranged from the front thereof (the left side of FIG. 3) toward the back thereof (the right side of FIG. 3). A flexible printed board 50 is inserted into the board accommodating recess 6.

The flexible printed board 50 being connected to the connector 1 includes a structure in which a plurality of conductive lines are wired on both sides of a flexible strip-shaped insulating film and a front side contact 50a and a back side contact 50b are formed at an end portion of the conductive lines.

A plurality of back side terminal accommodating groove 10 are concavely arranged to respectively accommodate a plurality of back side terminals 5, 5 . . . in an inner bottom side 6a of the board accommodating recess 6. The plurality of back side terminal accommodating groove 10 are arranged in equal intervals along a longitudinal direction of the housing 2.

Further, a lever accommodating recess 7 is concavely arranged from a plane side to a back side (the right side of FIG. 3) of the housing 2 to accommodate the lock lever 3 in a locked position. A plurality of front side terminal accommodating groove 11 are respectively and concavely arranged at a bottom side 7a of the lever accommodating recess 7 to accommodate the plurality of front side terminals 4, 4 . . . . The plurality of front side terminal accommodating groove 11 are arranged in equal intervals along the longitudinal direction of the housing 2. A front portion (the left side in FIG. 3) of each of the front side terminal accommodating groove 11 is connected to the board accommodating recess 6 and faces the back side terminal accommodating groove 10. In other words, each of the back side terminal accommodating groove 10 and each of the front side terminal accommodating groove 11 arranged along the longitudinal direction of the housing 2 are arranged in a same plane orthogonal to the longitudinal direction.

Side walls 2a and 2b are formed at both longitudinal ends of the housing 2 by concavely arranging the lever accommodating recess 7 and a pair of grooves 8 and 8 are concavely and respectively arranged in inner wall sides of the side walls 2a and 2b facing each other at a forward position of the side walls 2a and 2b. The grooves 8 and 8 accommodate rotational axes 9 and 9 of the lock lever 3 and rotatably support the lock lever 3.

The lock lever 3 integrally includes an operation lever 12 formed of an insulating resin in an elongated plate shape and a cam portion formed around an axis rotatable about the rotational axis 9 between the pair of rotational axes 9 and 9.

When the flexible printed board 50 is inserted into the board accommodating recess 6, the operation lever 12 is rotated about the rotational axis 9 to be positioned in an upright direction while the lock lever 3 is kept in a retracted position as illustrated in FIG. 3. At this time, a sectional shape of the cam portion 13 orthogonal to the axial direction becomes longitudinally long, and a front side contact portion 4a of the front side terminal 4 in contact with the front side contact 50a of the flexible printed board 50 is retracted from the board accommodating recess 6.

Figure 4:
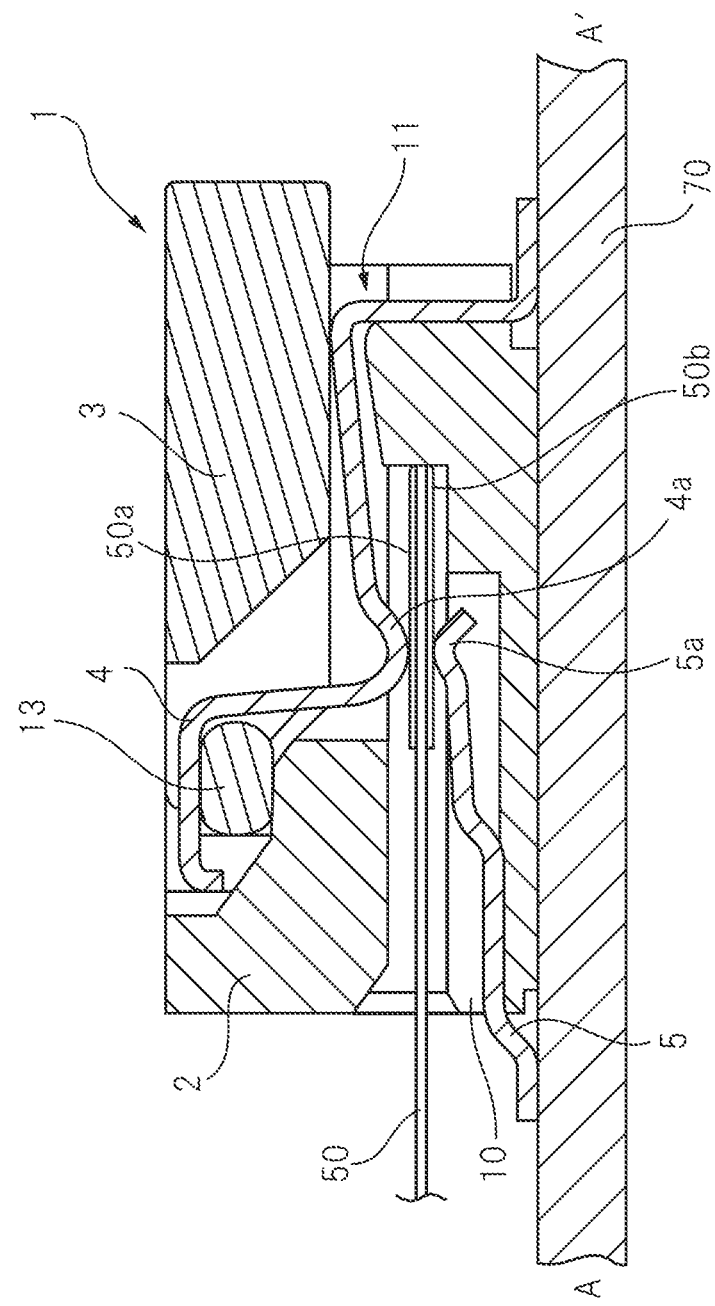
FIG. 4 is a cross-sectional view of the flexible printed board-connecting connector in which a lock lever is in a locked state.

The lock lever 3 is rotated to the locked position as illustrated in FIG. 4 by rotating the operation lever 12 about the rotational axis 9. As the cam portion 13 becomes a flat oval shape in the locked position, the front side contact portion 4a sticks out into the board accommodating recess 6 due to elasticity of the front side terminal 4 to elastically contact with the facing front side contact 50a.

The flexible printed board 50 being pressed downward due to elasticity of the front side terminal 4 bends the back side terminal 5 downward. Accordingly, the back side contact 50b of the flexible printed board 50 and a facing back side contact portion 5a of the back side terminal 5 make elastic contact by elasticity of the back side terminal 5. As a result, each contact of the flexible printed board 50 makes electrical connection with the conductive pattern of the circuit board 70 via the front side terminal 4 and the back side terminal 5.

Figure 5:
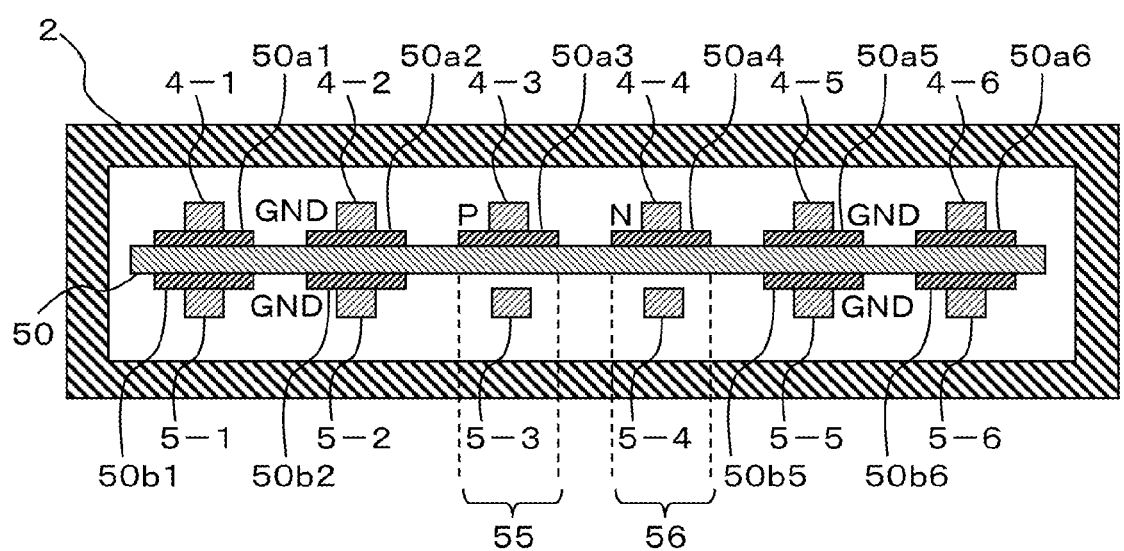
FIG. 5 is a schematic view of a cross-section of a housing and the flexible printed board.

FIG. 5 is a schematic view of a cross-section of the housing 2 and the flexible printed board 50. Reference numerals 50a1 to 50a6 designate the front side contact 50a of the flexible printed board 50 and reference numerals 50b1, 50b2, 50b5, and 50b6 designate the back side contact 50b. The back side contacts 50b1, 50b2, 50b5, and 50b6 are arranged at positions facing the front side contacts 50a1, 50a2, 50a5, and 50a6 with the flexible printed board 50 therebetween.

Reference numerals 4-1 to 4-6 designate the front side terminal 4 respectively contacting with the front side contacts 50a1 to 50a6. Reference numerals 5-1, 5-2, 5-5, and 5-6 designate the back side terminal 5 respectively contacting with the back side contacts 50b1, 50b2, 50b5, and 50b6. Reference numerals 5-3 and 5-4 designate the back side terminal 5 at positions facing the front side terminals 4-3 and 4-4.

The font side contacts 50a3 and 50a4 are contacts of the high speed differential signal lines through which Positive and Negative signals respectively flow. The front side contacts 50a2 and 50a5 and the back side contacts 50b2 and 50b5 are contacts of a ground pattern for matching impedance of the high speed differential signal lines being electrically connected to the front side contacts 50a3 and 50a4.

The back side contact 50b is not arranged in areas 55 and 56 respectively facing the front side contacts 50a3 and 50a4 with the flexible printed board 50 therebetween. As a result, electrostatic capacitance at the front side contacts 50a3 and 50a4 may be reduced as compared with a case of arranging the back side contact 50b in the areas 55 and 56.

Figure 6:
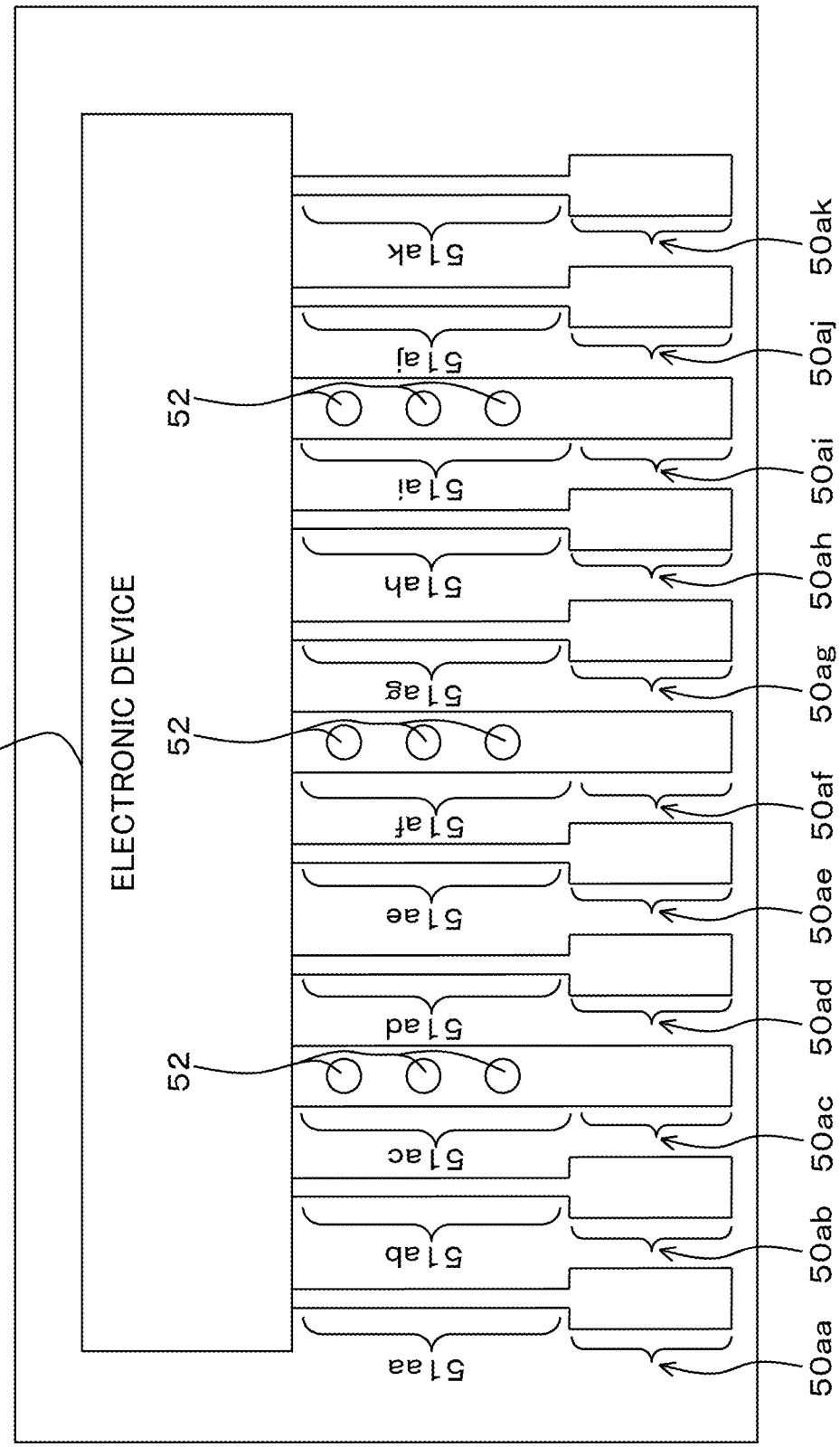
FIG. 6 is a schematic view of an example of a front side of the flexible printed board.

FIG. 6 is a schematic view of an example of a front side of the flexible printed board 50. Reference numerals 51aa and 51ak designate control lines arranged on the front side of the flexible printed board 50 and reference numerals 50aa and 50ak designate front side contacts of these control lines. Reference numerals 51ab and 51aj designate power lines arranged on the front side of the flexible printed board 50 and reference numerals 50ab and 50aj designate front side contacts of these power lines.

Reference numerals 51ad, 51ae, 51ag, and 51ah designate high speed differential signal lines arranged on the front side of the flexible printed board 50 and reference numerals 50ad, 50ae, 50ag, and 50ah designate front side contacts of these high speed differential signal lines. Reference numerals 51ac, 51af, and 51ai designate ground patterns arranged on the front side of the flexible printed board 50 and reference numerals 50ac, 50af, and 50ai designate front side contacts of the ground patterns.

Reference numeral 52 designates a via to electrically connect the ground patterns arranged on the front and back sides of the flexible printed board 50. Reference numeral 53a is an electronic device such as LSI (large scale integration) mounted on the front side of the flexible printed board 50.

Figure 7:
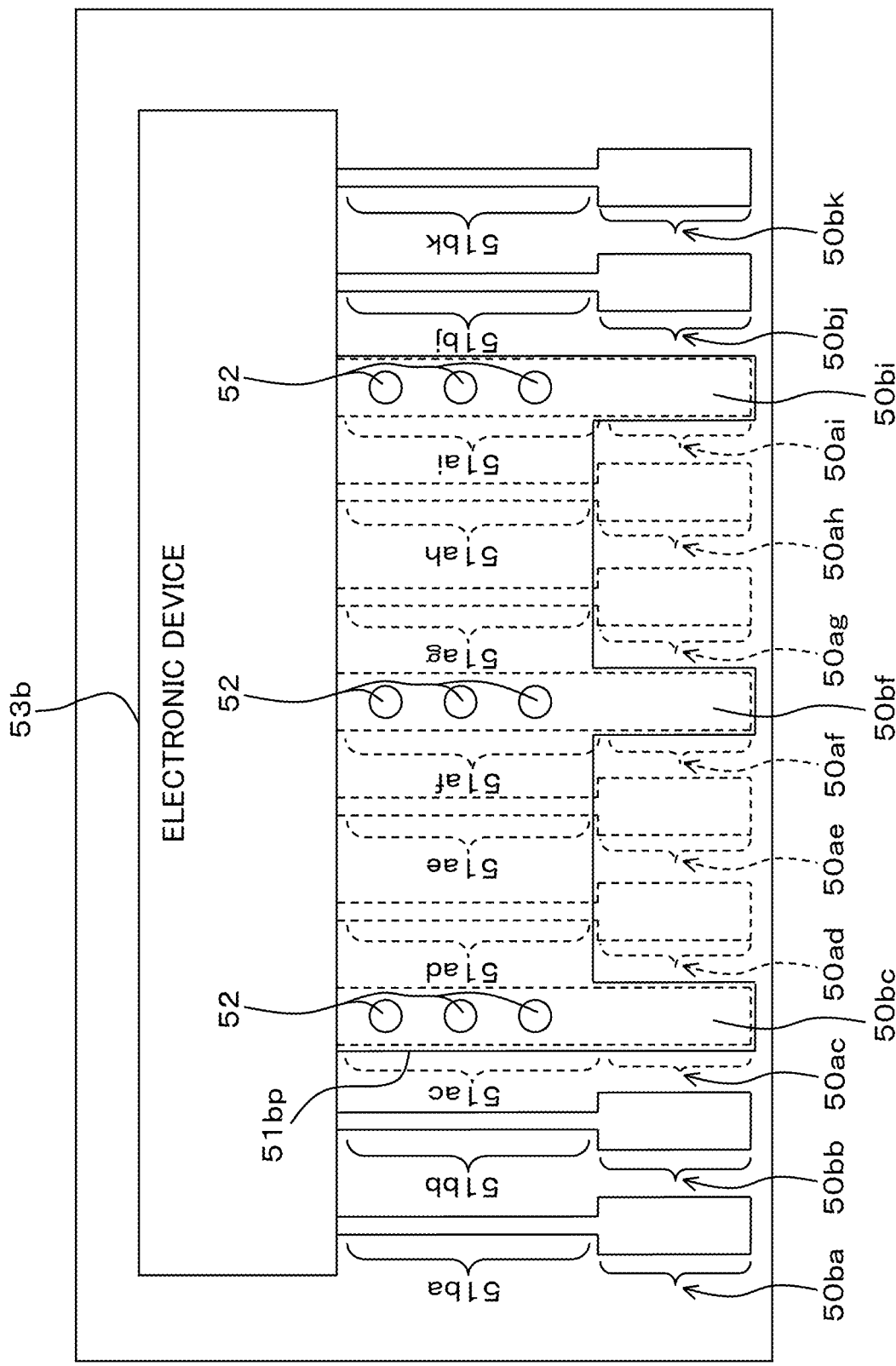
FIG. 7 is a schematic view of an example of a back side of the flexible printed board.

FIG. 7 is a schematic view of an example of a back side of the flexible printed board 50. Positions of the high speed differential signal lines 51ad, 51ae, 51ag, and 51ah, the ground patterns 51ac, 51af, and 51ai, and the front side contacts 50ac to 50ai on the front side of the flexible printed board 50 are illustrated in dashed lines.

Reference numerals 51ba, 51bb, 51bj, and 51bk designate control lines on the back side of the flexible printed board 50 and reference numerals 50ba, 50bb, 50bj, and 50bk designate back side contacts of these control lines. Reference numeral 51bp designates a ground pattern arranged on the back side of the flexible printed board 50 and reference numerals 50bc, 50bf, and 50bi designate back side contacts of the ground pattern 51bp. Reference numeral 53b designates an electronic device such as LSI mounted on the back side of the flexible printed board 50.

The ground pattern 51bp and the contacts 50bc, 50bf, and 50bi thereof are arranged in areas facing the ground patterns 51ac, 51af, and 51ai and the front side contacts 50ac, 50af, and 50ai with the flexible printed board 50 therebetween. In addition, the ground pattern 51bp is arranged in areas which face the high speed differential signal lines 51ad, 51ae, 51ag, and 51ah with the flexible printed board 50 therebetween. Thus, impedance of the high speed differential signal lines is matched to 50Ω for example.

On the other hand, the ground pattern 50bp and the contacts thereof are not arranged in areas facing the front side contacts 50ad, 50ae, 50ag, and 50ah of the high speed differential signal lines with the flexible printed board 50 therebetween. As a result, electrostatic capacitance at the front side contacts 50ad, 50ae, 50ag, and 50ah may be reduced as compared with a case of arranging ground patterns in areas facing the front side contacts 50ad, 50ae, 50ag, and 50ah.

Figure 8:
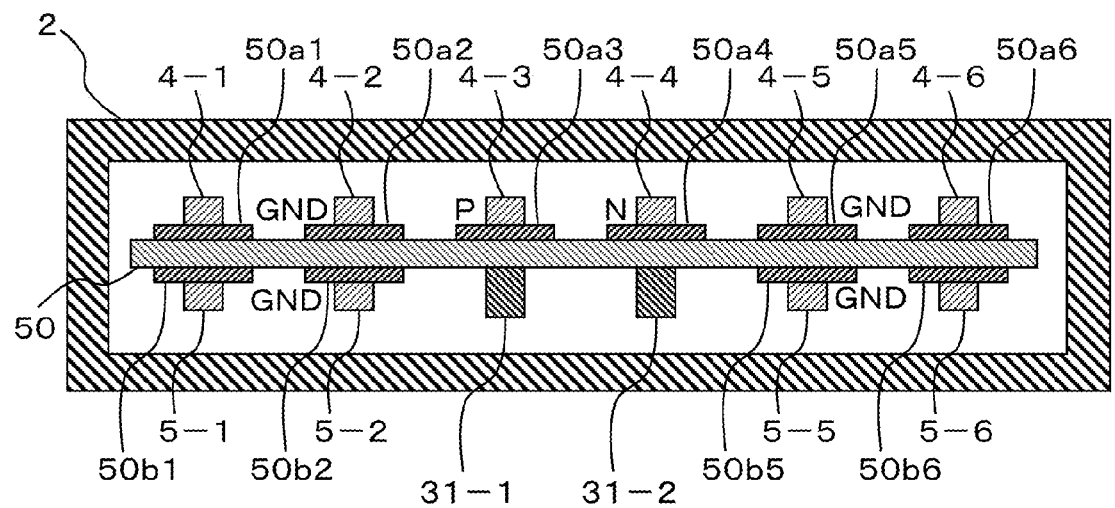
FIG. 8 is a schematic view of a cross-section of the housing and the flexible printed board.

FIG. 8 is a schematic view of a cross-section of other example of the housing 2 and the flexible printed board 50. The connector 1 may include support members 31-1 and 31-2 which support positions respectively facing the front side contacts 50a3 and 50a4 with the flexible printed board 50 therebetween. When a contact pitch of the connector 1 is sufficiently small or elasticity of the flexible printed board 50 is low, the support members 31-1 and 31-2 may not be included. The support members 31-1 and 31-2 include support bodies of dielectric material to support positions respectively facing the front side contacts 50a3 and 50a4.

When contacts are not arranged in areas 55 and 56 facing the front side contacts 50a3 and 50a4, the back side terminal 5 at these areas may float from the back side of the flexible printed board 50 as illustrated in FIG. 5. When bending occurs at the areas 55 and 56 due to the flexible printed board 50 not touching the back side terminal 5, contact failures between the front side contacts 50a3 and 50a4 and the front side terminals 4-3 and 4-4 may occur.

Occurrence of bending of the flexible printed board 50 may be reduced and occurrence of contact failures between the front side contacts 50a3 and 50a4 and the front side terminals 4-3 and 4-4 may be reduced by arranging the support members 31-1 and 31-2. However, when a pitch of the back side contact 50b is small, possibility of occurrence of contact failures due to bending of the flexible printed board 50 is small. Accordingly, the support members 31-1 and 31-2 may not be included when the pitch of the back side contact 50b is small. Similarly, the support members 31-1 and 31-2 may not be included when the elasticity of the flexible printed board 50 is low.

Figure 9:
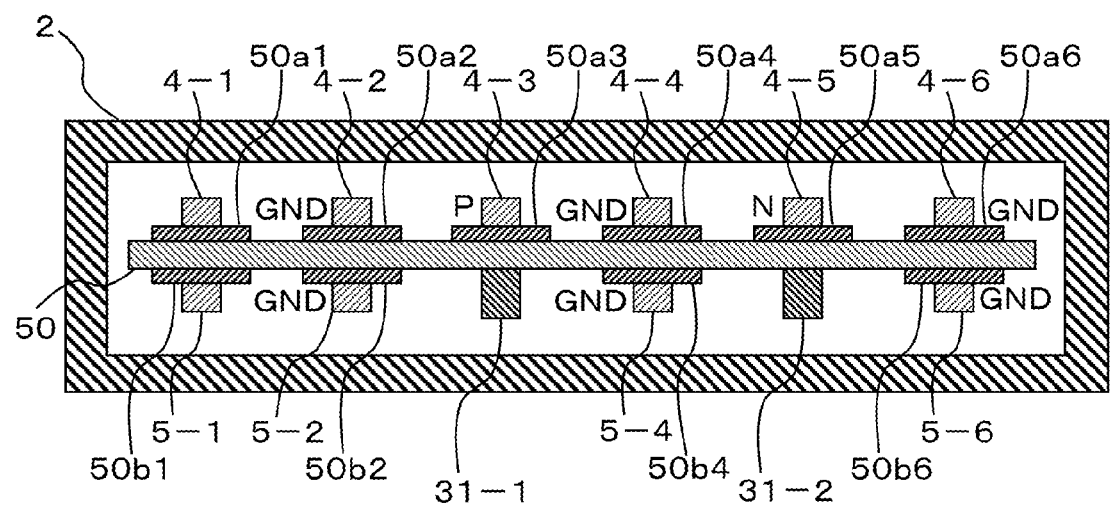
FIG. 9 is a schematic view of a cross-section of the housing and the flexible printed board.

FIG. 9 is a schematic view of a cross-section of other example of the housing 2 and other example of the flexible printed board 50. The flexible printed board 50 of FIG. 9 includes layouts of the front side contact 50a and the back side contact 50b different from those of the flexible printed board 50 of FIG. 5 and FIG. 8. Note that the same elements as those in FIG. 8 are designated by the same reference numerals as those used in FIG. 8 and explanations of the same functions will be omitted.

Reference numeral 50b4 designates one of the back side contact 50b of the flexible printed board 50. The back side contact 50b4 is arranged in a position facing the front side contact 50a4 with the flexible printed board 50 therebetween. Reference numeral 5-4 designates one of the back side terminal 5 in contact with the back side contact 50b4.

The front side contacts 50a3 and 50a5 are contacts of high speed differential signal lines through which Positive and Negative signals respectively flow. The front side contacts 50a2, 50a4, and 50a6 and the back side contacts 50b2, 50b4, and 50b6 are contacts of ground patterns for impedance matching for the high speed differential signal lines being electrically connected to the front side contacts 50a3 and 50a5.

The back side contact 50b is not arranged in areas respectively facing the front side contacts 50a3 and 50a5 with the flexible printed board 50 therebetween in the layouts of the front side contact 50a and the back side contact 50b as described above. As a result, electrostatic capacitance at the front side contacts 50a3 and 50a5 may be reduced as compared with a case of arranging the back side contact 50b in the areas. Further, the connector 1 includes the support members 31-1 and 31-2 to support positions respectively facing the front side contacts 50a3 and 50a5 with the flexible printed board 50 therebetween.

The support members 31-1 and 31-2 are collectively referred to as the support member 31 in the following description. The support member 31 may be of dielectric material in its entirety or a portion in contact with the flexible printed board 50 may be of dielectric material. The support member 31 is fixed to the housing 2 by being accommodated in the back side terminal accommodating groove 10 in place of the back side terminal 5.

By making the support member 31 interchangeable with the back side terminal 5, any terminal among a plurality of back side terminals 5, 5 . . . may be replaced with the support members 31. Thus, the common housing 2 may be used regardless of layouts of contacts through which signals pass.

Figure 10A:
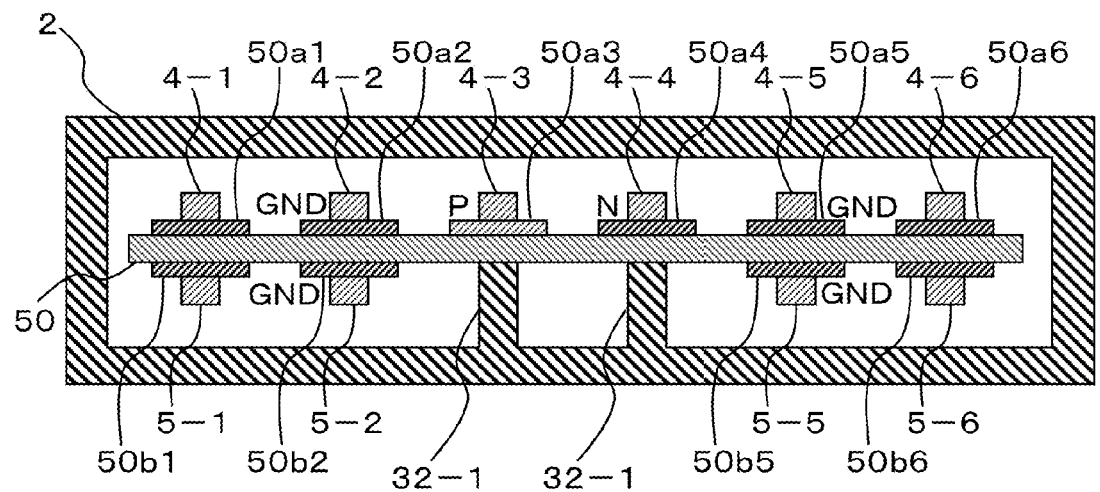
FIG. 10A is a schematic view of a cross-section of the housing and the flexible printed board.

FIG. 10A is a schematic view of a cross-section of other example of the housing 2 and the flexible printed board 50. Note that the same elements as those in FIG. 8 are designated by the same reference numerals as those used in FIG. 8 and explanations of the same functions will be omitted. Support bodies 32-1 and 32-2 of dielectric material for supporting positions respectively facing the front side contacts 50a3 and 50a4 with the flexible printed board 50 therebetween are formed with the housing 2.

A number of parts is reduced and reliability of the connector 1 is improved by integrally forming the support bodies 32-1 and 32-2 with the housing 2. Furthermore, workload for assembling the connector 1 is reduced. Similarly, in FIG. 9 in which the flexible printed board 50 is connected to the connector 1, support bodies of dielectric material formed with the housing 2 may support positions respectively facing the front side contacts 50a3 and 50a5.

Figure 10B:
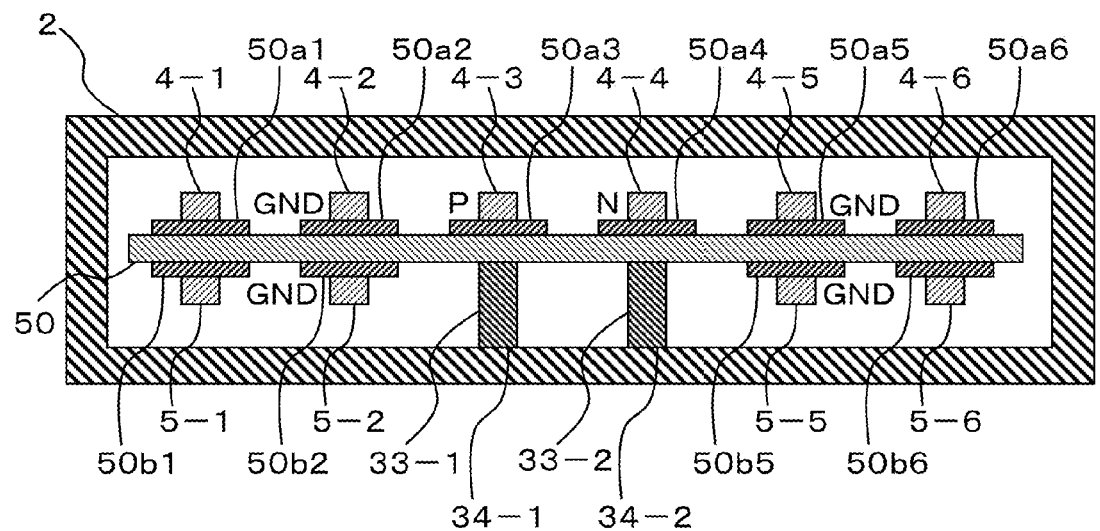
FIG. 10B is a schematic view of a cross-section of the housing and the flexible printed board.

FIG. 10B is a schematic view of a cross-section of other example of the housing 2 and other example of the flexible printed board 50. Support bodies 33-1 and 33-2 of dielectric material for supporting positions respectively facing the front side contacts 50a3 and 50a4 with the flexible printed board 50 therebetween are arranged at the back side of the flexible printed board 50.

The support bodies 33-1 and 33-2 are abut on abutment portions 34-1 and 34-2 arranged in the housing 2 to be abutted on the support bodies 33-1 and 33-2. The positions facing the front side contacts 50a3 and 50a4 are supported by placing the support bodies 33-1 and 33-2 in between the abutment portions 34-1 and 34-2 and the flexible printed board 50.

The abutment portions 34-1 and 34-2 may be a part of the housing 2. In other words, the support bodies 33-1 and 33-2 may directly abut on the housing 2. Alternatively, the abutment portions 34-1 and 34-2 may be other member attached to the housing 2. Similarly, in FIG. 9 in which the flexible printed board 50 is connected to the connector 1, support bodies of dielectric material arranged on the flexible printed board 50 may support the positions respectively facing the front side contacts 50a3 and 50a5.

According to the present embodiments, an increase in capacitance at a contact of a flexible printed board in contact with a terminal of the connector is reduced. As a result, deterioration of transmission characteristics of a high speed signal line due to a decrease in impedance caused by the increase in capacitance at the contact is reduced.

According to the present embodiments, occurrence of contact failures due to bending of a flexible printed board is reduced by supporting with a support body of dielectric material a part of the flexible printed board in which a terminal is not arranged.

In the embodiments described above, contacts on an opposite side facing contacts of high speed differential signal lines with a flexible printed board therebetween were omitted. In other embodiments, a pair of contacts of a ground pattern may be arranged adjacently at both sides of a contact of a single signal line (i.e. a single ended signal line), and contacts of a ground pattern respectively facing the pair of contacts may be arranged on an opposite side of the pair of contacts with a flexible printed board therebetween. A contact on the opposite side facing the single signal line with the flexible printed board therebetween may be omitted.

In the embodiments described above, contacts of high speed differential signal lines are arranged on a front side of a flexible printed board and back side contacts facing the contacts of the high speed differential signal lines with the flexible printed board therebetween are omitted. In other embodiments, contacts of high speed differential signal lines may be arranged on a back side and front side contacts facing the contacts of the high speed differential signal lines with a flexible printed board therebetween may be omitted.

Contacts of high speed differential signal lines may be arranged on both sides of a same flexible printed board. In this case, a layout of the contacts is determined so that the contacts of the high speed differential signal lines are placed to avoid front and back side contacts facing each other with the flexible printed board therebetween. The back side contacts facing the front side contacts of the high speed differential signal lines with the flexible printed board therebetween are omitted, and the front side contacts facing the back side contacts of the high speed differential signal lines with the flexible printed board therebetween are omitted.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A system formed by a connector and a flexible printed board, wherein
    the flexible printed board comprises:
        first and second contacts arranged side by side on a first side of an end portion of the flexible printed board;
        a first ground pattern arranged on the first side to be electrically connected to the first contact;
        a signal line pattern arranged on the first side to be electrically connected to the second contacts;
        a second ground pattern arranged on a second side facing the first side;
    the connector comprises:
        a housing configured to accommodate an end portion of the flexible printed board;
        first and second terminals configured to respectively contact the first and second contacts among a plurality of contacts arranged side by side on the first side of the end portion of the flexible printed board; and
        a third terminal configured to contact a third contact on the second side of the end portion of the flexible printed board opposite to the first side, the third contact being arranged at a position facing the first contact with the flexible printed board therebetween, wherein a support body of dielectric material, which is formed on the second side of the flexible printed board, supports a position on the second side facing the second contact with the flexible printed board therebetween, no electrical contact is arranged between the flexible printed board and the support body.

2. The system according to claim 1, wherein the housing comprises an abutment portion that abuts the support body.

3. The system according to claim 1, wherein the housing comprises:

a plurality of mounting portions configured to mount respective terminals capable of contacting a plurality of contacts arranged side by side on the second side of the end portion of the flexible printed board, wherein the support body is mounted in any one of the plurality of mounting portions.

4. The system according to claim 1, wherein the support body contacts the housing.

5. The system according to claim 2, wherein the support body is sandwiched between the flexible printed board and the abutment portion.

6. The system according to claim 1, the connector further comprising:

fourth and fifth terminals configured to respectively contact fourth and fifth contacts among the plurality of contacts arranged side by side on the first side of the end portion of the flexible printed board; and a sixth terminal configured to contact a sixth contact on the second side of the end portion of the flexible printed board, the sixth contact being arranged at a position facing the fifth contact with the flexible printed board therebetween, wherein the first and second contacts are adjacent each other, the second and fourth contacts are adjacent each other, and the fourth and fifth contacts are adjacent each other, and another support body supporting a position on the second side facing the fourth contact with the flexible printed board therebetween.

7. The system according to claim 1, the connector further comprising:

fourth, fifth, and sixth terminals configured to respectively contact fourth, fifth, and sixth contacts among the plurality of contacts arranged side by side on the first side of the end portion of the flexible printed board;

a seventh terminal configured to contact a seventh contact on the second side of the end portion of the flexible printed board, the seventh contact being arranged at a position facing the fourth contact with the flexible printed board therebetween; and an eighth terminal configured to contact an eighth contact on the second side of the end portion of the flexible printed board, the eighth contact being arranged at a position facing the sixth contact with the flexible printed board therebetween, wherein the first and second contacts are adjacent each other, the second and fourth contacts are adjacent each other, the fourth and fifth contacts are adjacent each other, and the fifth and sixth contacts are adjacent each other, and another support body for supporting a position on the second side facing the fifth contact with the flexible printed board therebetween.

8. The system according to claim 1, the connector further comprising:

a fourth terminal configured to contact a fourth contact among the plurality of contacts arranged side by side on the first side of the end portion of the flexible printed board; and a fifth terminal configured to contact a fifth contact on the second side of the end portion of the flexible printed board, the fifth contact being arranged at a position facing the fourth contact with the flexible printed board therebetween, wherein the first and second contacts are adjacent each other and the second and fourth contacts are adjacent each other.

9. The system according to claim 1, wherein the second ground pattern is arranged in an area facing the first contact, the first ground pattern, and the signal line pattern with the flexible printed board therebetween and not arranged in an area facing the second contact with the flexible printed board therebetween.

10. A connector connected with a flexible printed board, wherein the flexible printed board comprises:

first and second contacts arranged side by side on a first side of an end portion of the flexible printed board;

a first ground pattern arranged on the first side to be electrically connected to the first contact;

a signal line pattern arranged on the first side to be electrically connected to the second contacts;

a second ground pattern arranged on a second side facing the first side; and a support body of dielectric material, which is formed on the second side of the flexible printed board, at a position on the second side facing the second contact with the flexible printed board therebetween, no electrical contact is arranged between the flexible printed board and the support body, and the connector comprises:

a housing configured to accommodate an end portion of the flexible printed board;

first and second terminals configured to respectively contact the first and second contacts among a plurality of contacts arranged side by side on the first side of the end portion of the flexible printed board; and a third terminal configured to contact a third contact on the second side of the end portion of the flexible printed board opposite to the first side, the third contact being arranged at a position facing the first contact with the flexible printed board therebetween, wherein the support body of dielectric material is arranged between the flexible printed board and the housing.

11. The connector according to claim 10, wherein the housing comprises an abutment portion that abuts the support body.

12. The connector according to claim 10, wherein the housing comprises:

a plurality of mounting portions configured to mount respective terminals capable of contacting a plurality of contacts arranged side by side on the second side of the end portion of the flexible printed board, wherein the support body is mounted in any one of the plurality of mounting portions.

13. The connector according to claim 10, wherein the support body contacts the housing.

14. The connector according to claim 11, wherein
the support body is sandwiched between the flexible printed board and the abutment portion.

15. The connector according to claim 10, the connector further comprising:
fourth and fifth terminals configured to respectively contact fourth and fifth contacts among the plurality of contacts arranged side by side on the first side of the end portion of the flexible printed board; and
a sixth terminal configured to contact a sixth contact on the second side of the end portion of the flexible printed board, the sixth contact being arranged at a position facing the fifth contact with the flexible printed board therebetween, wherein
the first and second contacts are adjacent each other, the second and fourth contacts are adjacent each other, and the fourth and fifth contacts are adjacent each other, and
another support body supporting a position on the second side facing the fourth contact with the flexible printed board therebetween.

16. The connector according to claim 10, the connector further comprising:
fourth, fifth, and sixth terminals configured to respectively contact fourth, fifth, and sixth contacts among the plurality of contacts arranged side by side on the first side of the end portion of the flexible printed board;
a seventh terminal configured to contact a seventh contact on the second side of the end portion of the flexible printed board, the seventh contact being arranged at a position facing the fourth contact with the flexible printed board therebetween; and
an eighth terminal configured to contact an eighth contact on the second side of the end portion of the flexible printed board, the eighth contact being arranged at a position facing the sixth contact with the flexible printed board therebetween, wherein
the first and second contacts are adjacent each other, the second and fourth contacts are adjacent each other, the fourth and fifth contacts are adjacent each other, and the fifth and sixth contacts are adjacent each other, and
another support body for supporting a position on the second side facing the fifth contact with the flexible printed board therebetween.

17. The connector according to claim 10, the connector further comprising:
a fourth terminal configured to contact a fourth contact among the plurality of contacts arranged side by side on the first side of the end portion of the flexible printed board; and
a fifth terminal configured to contact a fifth contact on the second side of the end portion of the flexible printed board, the fifth contact being arranged at a position facing the fourth contact with the flexible printed board therebetween, wherein
the first and second contacts are adjacent each other and the second and fourth contacts are adjacent each other.

18. A flexible printed board connected to a connector, wherein
the flexible printed board comprises:
first and second contacts arranged side by side on a first side of an end portion of the flexible printed board;
a first ground pattern arranged on the first side to be electrically connected to the first contact;
a signal line pattern arranged on the first side to be electrically connected to the second contacts;
a second ground pattern arranged on a second side facing the first side; and
a support body of dielectric material, which is formed on the second side of the flexible printed board, at a position on the second side facing the second contact with the flexible printed board therebetween, no electrical contact is arranged between the flexible printed board and the support body, and
the connector comprises:
a housing configured to accommodate an end portion of the flexible printed board;
first and second terminals configured to respectively contact the first and second contacts among a plurality of contacts arranged side by side on the first side of the end portion of the flexible printed board; and
a third terminal configured to contact a third contact on the second side of the end portion of the flexible printed board opposite to the first side, the third contact being arranged at a position facing the first contact with the flexible printed board therebetween, wherein
the second ground pattern is arranged in an area facing the first contact, the first ground pattern, and the signal line pattern with the flexible printed board therebetween and not arranged in an area facing the second contact with the flexible printed board therebetween.

* * * * *